US006538439B1

(12) United States Patent
Ham

(10) Patent No.: US 6,538,439 B1
(45) Date of Patent: Mar. 25, 2003

(54) MRI APPARATUS INCLUDING A VACUUM ISOLATED GRADIENT COIL

(75) Inventor: Cornelis Leonardus Gerardus Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 77 days.

(21) Appl. No.: 09/668,861

(22) Filed: Sep. 25, 2000

(30) Foreign Application Priority Data

Sep. 23, 1999 (EP) .............................. 99203124

(51) Int. Cl.[7] ................................................ G01V 3/00
(52) U.S. Cl. ........................................ 324/318; 324/322
(58) Field of Search ............................. 324/318, 309, 324/307, 320, 322

(56) References Cited

U.S. PATENT DOCUMENTS

| | | | |
|---|---|---|---|
| 4,652,824 A | 3/1987 | Oppelt | 324/318 |
| 5,243,286 A * | 9/1993 | Rzedzian et al. | 324/318 |
| 5,278,502 A | 1/1994 | Laskaris et al. | 324/318 |
| 5,349,297 A * | 9/1994 | DeMeester et al. | 324/318 |
| 5,481,191 A * | 1/1996 | Rzedzian | 324/318 |
| 5,489,848 A | 2/1996 | Furukawa | 324/318 |
| 5,572,131 A * | 11/1996 | Rzedzian | 324/318 |
| 5,793,210 A * | 8/1998 | Pla et al. | 324/318 |
| 5,939,962 A * | 8/1999 | Tahara et al. | 324/319 |
| 6,147,494 A * | 11/2000 | Ham | 324/318 |
| 6,326,788 B1 * | 12/2001 | Mulder et al. | 324/309 |

FOREIGN PATENT DOCUMENTS

EP 0629875 B1 12/1994 .......... G01R/33/38

* cited by examiner

*Primary Examiner*—Edward Lefkowitz
*Assistant Examiner*—Dixomara Vargas
(74) *Attorney, Agent, or Firm*—John Vodopia

(57) ABSTRACT

A magnetic resonance imaging apparatus is provided with a gradient coil system for generating a magnetic gradient field in an imaging volume of the apparatus, the gradient coil system being arranged in a space providing isolation by means of vacuum, and also with an RF coil for generating an alternating RF magnetic field in the imaging volume, wherein the RF coil surrounds the imaging volume. An RF shield for concentrating the power generated by the RF field in the RF frequency coil substantially in the imaging volume is located in the vacuum isolated space between the gradient coil system and the RF coil.

6 Claims, 1 Drawing Sheet

MRI APPARATUS INCLUDING A VACUUM ISOLATED GRADIENT COIL

BACKGROUND OF THE INVENTION

The invention relates to a magnetic resonance imaging apparatus which is provided with a gradient coil system arranged in a vacuum isolated space to generate a magnetic gradient field in an imaging volume of the apparatus, and with an RF coil which at least partly encloses the imaging volume to generate an RF magnetic alternating field in the imaging volume.

An apparatus of this kind is known from U.S. Pat. No. 5,489,848.

A magnetic resonance imaging apparatus for medical purposes, also referred to as an MRI apparatus, is arranged to form images of cross-sections or so-called slices of a body. To this end, in such an apparatus a strong, steady, uniform magnetic field is generated in a volume intended for imaging, that is, the so-called imaging volume. A magnetic gradient field is superposed on the uniform field in order to indicate the location of the slice to be imaged. The atoms in the tissue present in the imaging volume are then excited by means of an RF field. The spin resonance signal formed upon relaxation of the excited atoms is then used to reconstruct an image of the slice indicated by means of the gradient field. The steady, uniform field, also referred to as the main field, is generated by means of a coil system (superconducting or not). This coil system and the associated envelope together may be shaped as a short tube in which the imaging volume is situated. The diameter of this tube is determined by the dimensions of the patients to be examined and hence, has a given minimum value, for example, of the order of magnitude of 90 cm.

The gradient coil system for generating a magnetic gradient field in the imaging volume is arranged within the tube so as to enclose the imaging volume. The gradient coil system includes sets of gradient coils for generating an associated gradient field, i.e., for example, one set for each of the three co-ordinate directions, each system of gradient coils being referred to as a primary gradient coil. Three axial fields with gradients in the three coordinate directions x, y and the axial direction z are thus produced. During the imaging process current pulses are applied to the gradient coils so that magnetic stray fields occur inevitably outside the imaging volume. These stray fields are liable to induce eddy currents in the conductive parts of the apparatus which are situated in the vicinity of the gradient coils, notably the metal parts provided so as to generate the main field, for example the tubular part of the envelope for the coil system, any heat shields situated within the envelope (in the case of a superconducting coil system), or the coils for the main field itself. The magnetic fields produced by the eddy currents cause distortions in the image to be formed. They also cause heat dissipation in the parts conducting the eddy currents. This is a drawback notably in the case of a superconducting coil system, because the liquid helium which serves as the cooling medium boils down faster. Finally, they also cause a disturbing noise since the parts conducting the eddy currents are situated in a magnetic field and hence, are subject to Lorentz forces causing deformation of the parts. In order to counteract the adverse effects of such stray fields, shielding coils are used so as to shield or compensate the magnetic fields generated outside the imaging volume by the primary coils. The current directions in the primary coils and the shielding coils oppose one another and hence, these coils are also subject to oppositely directed Lorentz forces. In order to minimize the vibrations due to such forces, these two coils are mechanically interconnected so as to form one rigid unit. However, the forces of the coils do not fully compensate one another. Consequently, a shielded coil also starts to vibrate and hence produces noise, so that there will still be a noise pollution which is experienced as being excessive. Consequently, the gradient coil system having primary coils and shielding coils is accommodated in a vacuum isolated space in the MRI apparatus disclosed in the cited U.S. Pat. No. 5,489,848.

According to the cited United States patent above, the RF coil for generating the magnetic alternating field is situated within the coils for generating the main field and the gradient coil system and encloses the imaging volume. The RF coil, therefore, is situated in an atmospheric space.

It is a drawback of the MRI apparatus described in the cited U.S. Pat. No. 5,489,848, however, that a substantial part of the power of the RF alternating field, obtained by means of the RF coil, is dissipated in the gradient coil system.

SUMMARY OF THE INVENTION

Therefore, it is an object of the present invention to limit this power loss and to provide an MRI apparatus in which the RF power is efficiently used. It is another object of the present invention to implement the steps for minimizing the power loss according to the invention in a structurally advantageous manner.

The objects of the present invention are achieved in that the MRI apparatus of the kind set forth according to the invention is characterized in that an RF shield is arranged in the vacuum isolated space between the gradient coil system and the RF coil. As a result of the presence of an RF shield, the power of the RF alternating field is concentrated predominantly in the imaging volume.

The mounting of an RF shield is known from U.S. Pat. No. 5,179,338. However, therein the shield is mounted on the outer wall of the vacuum isolated space bounded by the primary gradient coils and the shielding coils. Therefore, these coils are not suspended resiliently so that, despite the vacuum created in the space within the gradient coil, the noise reduction achieved is not optimum. Furthermore, because a minimum distance must be maintained between the RF coil and the RF shield, the mounting of an RF shield outside the vacuum isolated space means that for the same imaging volume to be maintained the dimensions of the MRI apparatus will become slightly larger.

In a first embodiment the RF shield is rigidly mounted on the inner wall of the vacuum isolated space so that the RF shield can be readily correctly positioned relative to the RF coil. The RF coil in a second embodiment is rigidly mounted on the inner side of the gradient coil system, that is, on the side thereof which faces the wall of the vacuum isolated space. From a structural point of view this offers the advantage that the gradient coil and the RF shield can be arranged in the relevant space as one unit and that the minimum distance between the RF coil and the RF shield can be realized in a manner that benefits the dimensions of the MRI apparatus However, this unit should be accurately centered in the relevant space.

These and other aspects of the invention are apparent from and will be elucidated, by way of non-limitative example, with reference to the embodiment described hereinafter and the accompanying drawing.

DETAILED DESCRIPTION OF THE PREFERRED EMBODIMENTS

Figure 1:
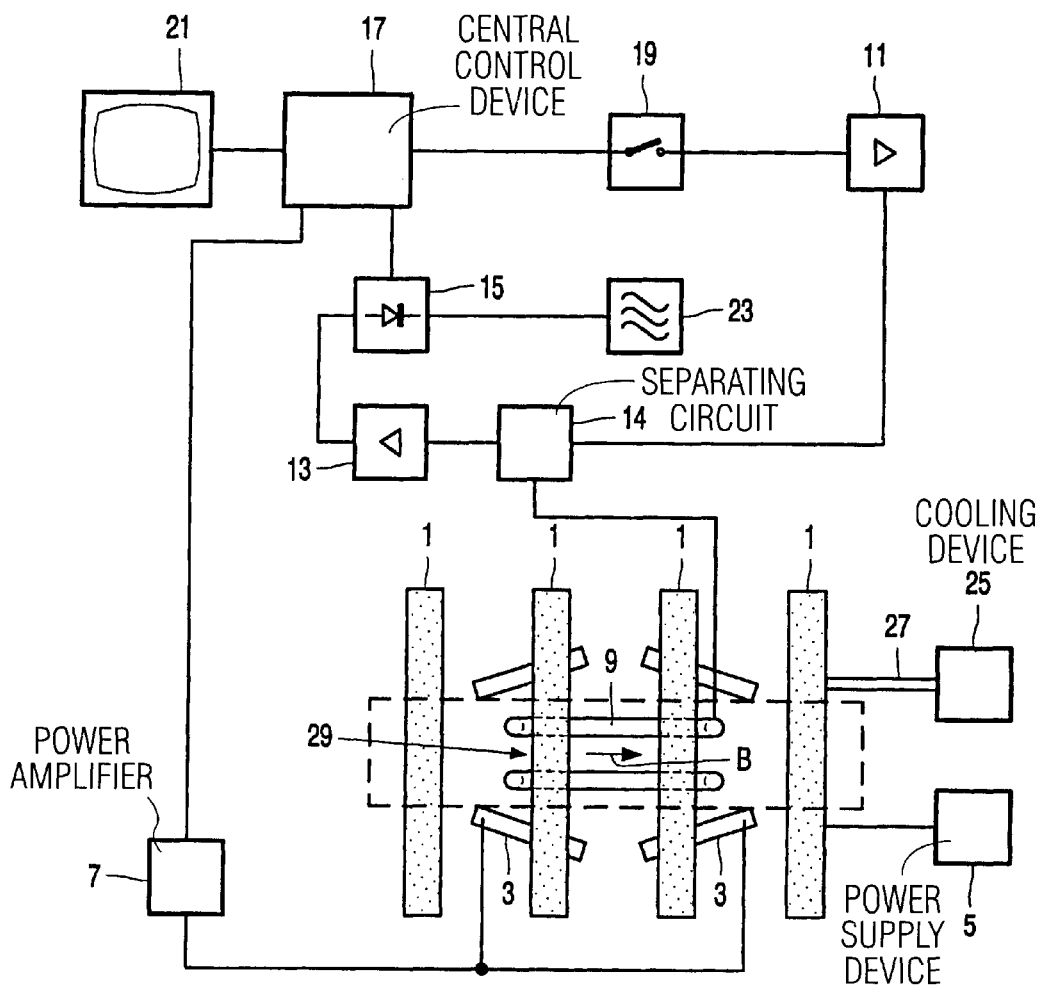
FIG. 1 shows diagrammatically the general construction of a magnetic resonance imaging apparatus.

The magnetic resonance apparatus which is diagrammatically shown in FIG. 1 includes a first magnet system 1 for generating a steady, uniform magnetic field B, a second magnet system 3 (the gradient coil system) for generating magnetic gradient fields, a power amplifier 7 for the gradient coil system 3, and a power supply device 5 for the first magnet system 1. An RF coil 9 serves to generate an RF magnetic alternating field. The RF coil 9 is connected to an RF transmitter device which includes an RF source 11. The RF coil 9 can also be used for the detection of spin resonance signals generated by the RF transmitter field in an object to be examined (not shown). The RF coil 9 is connected to an RF receiver device which includes a signal amplifier 13. The output of the signal amplifier 13 is connected to a detector circuit 15 which is connected to a central control device 17. The central control device 17 controls a modulator 19 for the RF source 11, the power amplifier 7 and a monitor 21 for image display. An RF oscillator 23 controls the modulator 19 as well as the detector 15 which process the measuring signals. A cooling device 25 with cooling ducts 27 is provided for the cooling of the magnet coils of the first magnet system. The RF coil 9, being arranged within the magnet systems 1 and 3, encloses an imaging volume 29 which, in the case of an apparatus for medical diagnostic measurements, is large enough to accommodate a patient to be examined, for example the head and the neck. Thus, a steady magnetic field B, gradient fields for selecting object slices, and a spatially uniform RF alternating field can be generated within the imaging volume 29. The RF coil 9 can combine the functions of transmitter coil and measuring coil. Accordingly, there is provided a separating circuit 14 for separating the forward and the return signal traffic. Alternatively, different coils can be used for the two functions. For example, surface coils may act as measuring coils.

Figure 2:
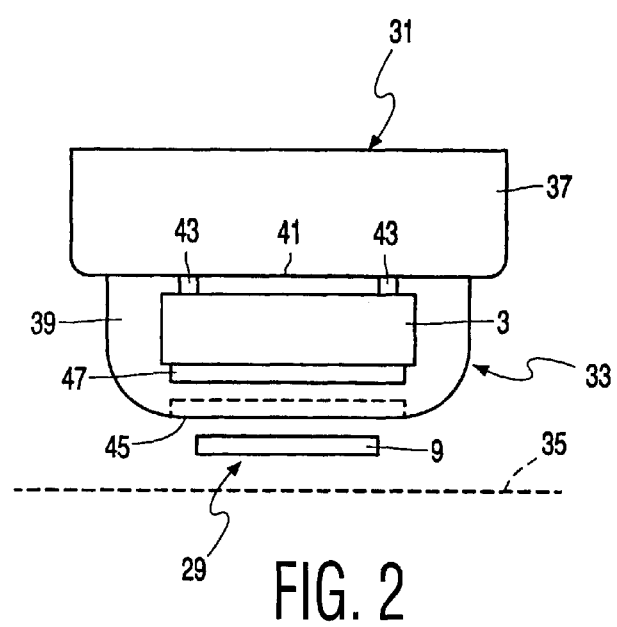
FIG. 2 shows diagrammatically the positioning of the main, gradient and RF coils as well as the RF shield in accordance with the invention.

FIG. 2 shows the construction according to the invention of the housing 31 of the magnet coils of the first magnet system 1, the gradient coil system 3 and the housing 33 thereof, and the RF coil 9. The assembly has a rotationally symmetrical appearance with an axis of rotational symmetry 35. The Figure is a cross-sectional view taken in a plane through the axis 35, so that the complete assembly has a substantially annular shape. The housing 31 encloses a space 37 in which there are provided coils (not shown in this Figure) for generating the uniform magnetic field B. This system for generating the uniform magnetic field may be a superconducting system. Thus, the space 37 is arranged to accommodate all elements required so as to maintain the necessary low. temperatures, notably a vacuum vessel and radiation shields.

The housing 33 which is rigidly connected to the housing 31 encloses a vacuum isolated space 39 for the gradient coil system. The gradient coil system 3, constituting a mechanically rigid unit, is attached to the partition 41 between the space 37 for the magnet system 1 and the space 39 for the gradient coil system 3 by way of fastening elements 43. Thereby, the system 3 is resiliently mounted in such a manner that the vibrations produced therein are attenuated or damped to such an extent that any remaining vibrations in the gradient system are not transferred (or only in strongly suppressed form) to the surrounding construction. The gradient coil system 3 may again be composed of primary x, y and z coils and x, y and z shielding coils. The construction of the gradient coil system, however, is not of relevance to the present invention and, therefore, it will not be described in detail. Because of the absence of an atmosphere surrounding the gradient coil system 3, no noise vibrations are transferred thereby, so that the coil system 3 cannot cause noise pollution in this way.

On the inner side of the gradient coil system 3, i.e. on the side of the housing 33 which faces the outer wall 45, there is provided an RF shield 47 for concentrating the power of the RF alternating field generated in the RF coil 9 predominantly in the imaging volume 29.

Instead of mounting this RF shield against the inner side of the gradient coil system, it can also be mounted against the wall 45 inside the housing 33 as denoted by dashed lines in FIG. 2.

What is claimed is:

1. A magnetic resonance imaging apparatus comprising:
   a gradient coil system arranged in a vacuum isolated space to generate a magnetic gradient field in an imaging volume of the apparatus;
   an RF coil which at least partly encloses the imaging volume to generate an RF magnetic alternating field in said imaging volume; and
   an RF shield (a) arranged within the vacuum isolated space of the gradient coil system, and (b) positioned between the gradient coil system and the RF coil.

2. The magnetic resonance imaging apparatus as claimed in claim 1, wherein further the RF shield is (c) rigidly mounted on an inner wall of the vacuum isolated space.

3. The magnetic resonance imaging apparatus as claimed in claim 1, wherein further the RF shield is (c) rigidly mounted on an inner side of the gradient coil system with respect to an axis of rotational symmetry of said magnetic resonance imaging apparatus.

4. A magnetic resonance imaging apparatus which includes a gradient coil system arranged in a vacuum isolated space to generate a magnetic gradient field in an imaging volume of the apparatus, and an RF coil which at least partly encloses the image volume to generate an RF magnetic alternating field in the imaging volume, comprising:
   an RF shield configured to be (a) arranged within the vacuum isolated space of the gradient coil system, and (b) positioned between the gradient coil system and the RF coil.

5. The magnetic resonance imaging apparatus as claimed in claim 4, wherein further the RF shield is configured to be (c) rigidly mounted on an inner wall of the vacuum isolated space.

6. The magnetic resonance imaging apparatus as claimed in claim 4, wherein further the RF shield is configured to be (c) rigidly mounted on an inner side of the gradient coil system with respect to an axis of rotational symmetry of said magnetic resonance imaging apparatus.

* * * * *